United States Patent
Thomson et al.

(10) Patent No.: US 12,520,450 B2
(45) Date of Patent: Jan. 6, 2026

(54) THERMAL REGULATING DEVICE

(71) Applicant: NORTHROP GRUMMAN SYSTEMS CORPORATION, Falls Church, VA (US)

(72) Inventors: Erin Marie Thomson, Baltimore, MD (US); Lucinda G. Martin, Severna Park, MD (US); Patrick K. Richard, Baltimore, MD (US); Richard Michael Rinick, Millersville, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 180 days.

(21) Appl. No.: 18/351,970

(22) Filed: Jul. 13, 2023

(65) Prior Publication Data

US 2025/0024637 A1 Jan. 16, 2025

(51) Int. Cl.
*H05K 7/20* (2006.01)
*G01R 31/28* (2006.01)

(52) U.S. Cl.
CPC ..... *H05K 7/20263* (2013.01); *G01R 31/2849* (2013.01); *H05K 7/20281* (2013.01)

(58) Field of Classification Search
CPC ........... G01R 31/2849; H05K 7/20263; H05K 7/20281
See application file for complete search history.

(56) References Cited

U.S. PATENT DOCUMENTS

| | | | |
|---|---|---|---|
| 10,330,395 B2 | 6/2019 | Franz et al. | |
| 10,458,724 B2 | 10/2019 | Franz et al. | |
| 11,112,188 B1 | 9/2021 | Ballew et al. | |
| 11,516,943 B2 | 11/2022 | Bilan et al. | |
| 2015/0096719 A1 | 4/2015 | Moskaitis et al. | |
| 2021/0048255 A1 | 2/2021 | De Bock et al. | |
| 2022/0154992 A1 | 5/2022 | Siddiqui et al. | |

FOREIGN PATENT DOCUMENTS

| | | | | |
|---|---|---|---|---|
| CN | 102869932 A | | 1/2013 | |
| CN | 105698570 A | | 6/2016 | |
| CN | 112822910 A | * | 5/2021 | ............... H05K 7/20 |
| WO | 2012120969 | | 9/2012 | |
| WO | WO-2014158196 A1 | * | 10/2014 | ......... H05K 7/20836 |
| WO | 2022-194902 | | 9/2022 | |

OTHER PUBLICATIONS

WOISR (Written Opinion & International Search Report) for corresponding PCT/US2024/032763, mailed Sep. 20, 2024.
TWOA: Office Action issued Jul. 16, 2025 for corresponding TW application No. 113121480.

* cited by examiner

*Primary Examiner* — Christopher E Mahoney
(74) *Attorney, Agent, or Firm* — Tarolli, Sundheim, Covell & Tummino LLP

(57) ABSTRACT

A thermal regulating device is provided that includes a head portion including an inlet port and an outlet port, and a tubular, rod-shaped portion in fluid communication with the head portion at a first end and being enclosed at a second end opposite that of the first end. An axial cartridge is disposed in the tubular, rod-shaped portion, where the axial cartridge provides thermal transfer to an outer surface of the tubular, rod-shaped portion. The tubular, rod-shaped portion detachably mates with a device to provide thermal transfer to the device.

12 Claims, 4 Drawing Sheets

THERMAL REGULATING DEVICE

TECHNICAL FIELD

This disclosure relates generally to devices, systems, and method for thermal regulation of electronic components.

BACKGROUND

Electronic circuits are typically tested over a range of temperatures to ensure operational effectiveness at a variety of environmental conditions. Brazed cooling plates are used to thermally regulate a temperature of electronic circuitry undergoing thermal testing. A thermal regulating fluid is channeled through a channel integral to the brazed cooling plate via an inlet and an outlet. A temperature of the thermal regulating fluid is regulated via a thermal regulating fluid source. The brazed cooling plate is permanently mounted to a heat sink connected to the electronic circuitry. After testing is complete, the brazed cooling plate is not removed from the heat sink.

SUMMARY

The following presents a simplified summary in order to provide a basic understanding of the subject disclosure. This summary is not an extensive overview of the subject disclosure. It is not intended to identify key/critical elements or to delineate the scope of the subject disclosure. Its sole purpose is to present some concepts of the subject disclosure in a simplified form as a prelude to the more detailed description that is presented later.

One example of the subject disclosure is a thermal regulating device that includes a head portion including an inlet port and an outlet port, and a tubular, rod-shaped portion in fluid communication with the head portion at a first end and being enclosed at a second end opposite that of the first end. An axial cartridge is disposed in the tubular, rod-shaped portion, where the axial cartridge provides thermal transfer to an outer surface of the tubular, rod-shaped portion. The tubular, rod-shaped portion detachably mates with a device to provide thermal transfer to the device.

Another example of the subject disclosure includes a method of thermally testing device that includes providing a thermal regulating system that includes a thermal regulating fluid source, a thermal regulating device, and a device for thermal regulation. The thermal regulating device is removable mated to the device. The thermal regulating fluid source is removably coupled to the thermal regulating device. The thermal regulating device is thermally regulated via a thermal regulating fluid from the thermal regulating fluid source. The thermal regulating device is then removed from the device.

In still another example of the subject disclosure is a thermal testing system that includes an electronic circuit assembly comprising a heat sink and a thermal regulating device removably coupled to the heat sink of the electronic circuit assembly. A thermal regulating fluid source is removably coupled to the thermal regulating device to provide a thermal regulating fluid to the thermal regulating device. The thermal regulating device is configured to receive and discharge the thermal regulating fluid from the thermal regulating fluid source to regulate thermal transference to the electronic circuit assembly via the heat sink.

BRIEF DESCRIPTION OF THE DRAWINGS

The accompanying drawings, which are incorporated in and constitute a part of the specification, illustrate various systems, methods, and other examples of the disclosure. Illustrated element boundaries (e.g., boxes, groups of boxes, or other shapes) in the figures represent one example of the boundaries. In some examples one element may be designed as multiple elements or multiple elements may be designed as one element. In some examples, an element shown as an internal component of another element may be implemented as an external component and vice versa.

DETAILED DESCRIPTION

Figure 1:
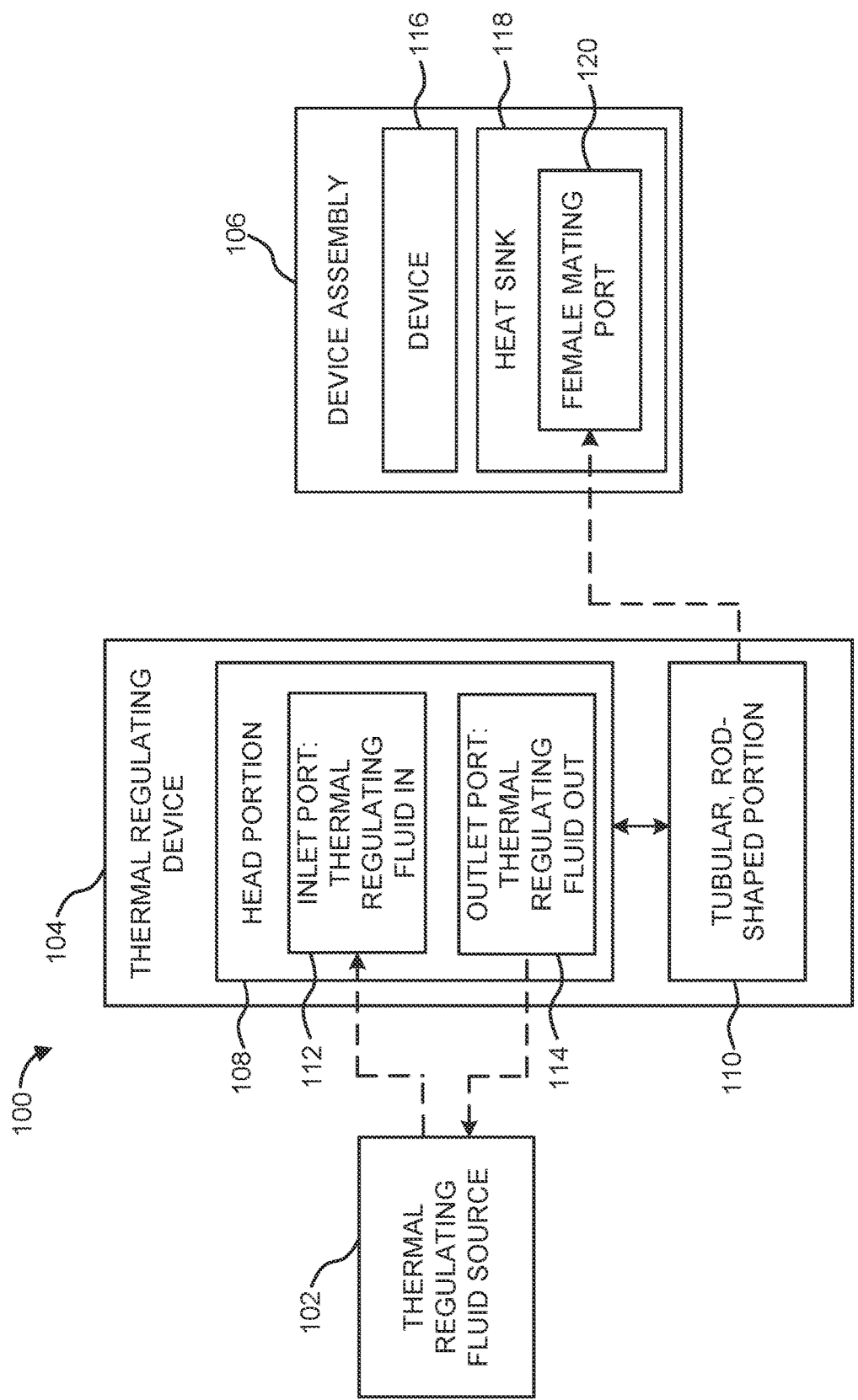
FIG. 1 illustrates an example block diagram of an example thermal testing system.

The disclosure is now described with reference to the drawings, wherein like reference numerals are used to refer to like elements throughout. In the following description, for purposes of explanation, numerous specific details are set forth in order to provide a thorough understanding of the subject disclosure. It may be evident, however, that the subject disclosure can be practiced without these specific details. In other instances, well-known structures and devices are shown in block diagram form in order to facilitate describing the subject disclosure.

While specific characteristics are described herein (e.g., thickness, orientation, configuration, etc.), it is to be understood that the features, functions and benefits of the subject disclosure can employ characteristics that vary from those described herein. These alternatives are to be included within the scope of the disclosure and claims appended hereto.

Disclosed herein is a thermal regulating device to regulate a temperature or a temperature range (via thermal transference) of a device (e.g., electronic components, electronic circuitry, etc.) during thermal testing of the device, which overcomes disadvantages described below. As described herein, the term "device" refers to any of a variety of devices for which thermal regulation and/or testing may be required, necessary, and/or advantageous, and is not limited to electronic circuits. The thermal regulating device is comprised of a head portion and a tubular, rod-shaped portion integrated with the head portion. The head portion includes an inlet to receive a thermal regulating fluid and an outlet to discharge the thermal regulating fluid. The tubular, rod-shaped portion is insertable and removable to and from a device assembly (e.g., electronic circuit assembly) to regulate a temperature or a temperature range of the device in the device assembly. During testing, the tubular, rod-shaped portion is inserted into a female mating port of the circuit assembly (e.g., female mating port of a heat sink) and the thermal regulating fluid flows into the inlet, through the tubular, rod-shaped portion and out the outlet. A temperature of the thermal regulating fluid is controlled by a thermal regulating fluid source and can be adjusted to a desired temperature or a temperature range based on the device in the device assembly. An axial cartridge is disposed inside the tubular, rod-shaped portion. The axial cartridge includes fins that facilitate the transfer of the temperature of the thermal regulating fluid to an outer surface of the tubular, rod-shaped portion. Once the testing is complete the thermal regulating device is removed from the device assembly and can be reattached to and reused for additional testing on other devices.

The simple design of the thermal regulating device enables the thermal regulating device to be fabricated as a single component through an additive manufacturing process. The additive manufacturing process ensures that the thermal regulating device has a continuous (smooth) outer surface. The continuous surface avoids discontinuities, such as joints or weld seams that could produce leaks in the tubular, rod-shaped portion and hinder inserting and removing the tubular, rod-shaped portion into and from the female mating port in the device assembly. Although, the tubular, rod-shaped portion of the thermal regulating device described herein and illustrated in the figures has a circular cross-section, the cross-section can be any shape that facilitates the transfer of the temperature of the thermal regulating fluid to the outer surface of the tubular, rod-shaped portion.

In addition, the simple design of the thermal regulating device allows for changes in thermal regulating fluids (e.g., air, water, PAO, EGW, JP-8, alcohol, etc.) that can be tailored for specific requirements (e.g., test bench, product applications (e.g., temperature tuning, tactical use, etc.), etc.) without the need to change a mating part (e.g., heat sink) and with no fluid contamination to the mating part. In other words, separate thermal regulating devices can be used for different regulating fluids. Thus, when a different thermal regulating fluid is desired, the thermal regulating device is simply replaced with another having the desired regulating fluid. Therefore, purging the thermal regulating device is not required and as a result, fluid cross contamination is not an issue.

One example of a conventional thermal regulating device comprises a brazed plate soldered onto a surface of a heat sink of a device assembly (e.g., electronic circuit assembly). The device assembly includes a device (e.g., electronic circuitry) for thermal regulation that is connected to an opposite surface of the heat sink. The plate includes a fluid channel where the fluid channel includes an inlet and an outlet. A thermal regulating fluid is channeled through the channel via the inlet and output. A temperature of the thermal regulating fluid is regulated via a thermal regulating fluid source. In this example, the plate is permanently mounted to the heat sink. Thus, after testing is complete, the plate is not removed from the heat sink. Rather, the plate is packaged and shipped to the end user. The plate, however, has no functional use for the end user after testing is complete. The plate cannot be reused on any other devices for thermal testing and is essentially discarded. A new plate must be fabricated for any other devices requiring thermal testing. In other words, a new plate must be fabricated for each and every device requiring thermal testing.

As a result, the thermal regulating plate has several disadvantages. For example, the plate is not reusable since it is permanently attached to the heat sink. Thus, the weight of the plate adds unnecessary weight to the overall device assembly, which is not desirable to the end user. In addition, different custom plates must be fabricated for each and every device assembly requiring thermal testing, which results in higher fabrication costs. Still further, in instances where more than one thermal regulating fluid is used for thermally testing a device assembly, the channel in the plate must be purged. This can result in longer testing cycles and cross contamination between the thermal regulating fluids. The thermal regulating device disclosed herein that includes a tubular, rod-shaped portion connected to a head portion overcomes the aforementioned disadvantages.

FIG. 1 illustrates an example block diagram of a thermal testing system 100 that includes a thermal regulating fluid source 102, a thermal regulating device 104, and a device assembly (e.g., electronic circuit assembly) 106. The thermal regulating fluid source 102 provides a thermal regulating fluid (e.g., air, water, PAO, EGW, JP-8, alcohol, etc.) to the thermal regulating device 104 based on an application of the electronic circuit assembly 106 and/or on specific requirements (e.g., test bench, product applications (e.g., temperature tuning, tactical use, etc.), etc.). The thermal regulating device 104 is an integrated unit that includes a head portion 108 and a tubular, rod-shaped portion 110. The head portion 108 includes an inlet port 112 and an outlet port 114. The tubular, rod-shaped portion 110 fluidly communicates with the head portion 108 at a first end and is enclosed and an opposite second end. The thermal regulating device 104 is configured to receive and discharge the thermal regulating fluid from the thermal regulating fluid source 102 via the inlet and outlet ports 112, 114 of the head portion 108. Thus during testing, the tubular, rod-shaped portion 110 functions as a heat exchanger to regulate the temperature transferred (thermal transference) to the electronic circuit assembly 106.

The device assembly 106 includes a device (e.g., electronic circuitry) 116 and a heat sink 118. While the example disclosed herein is described as an electronic circuit assembly comprised of electronic circuitry (e.g., electronic circuits, transistors, capacitors, resistors, etc.), any variety of devices for which thermal regulation and/or testing may be desired can be regulated and/or tested with the thermal regulating device 104. Thus, the example described herein is not limited to electronic circuitry. The electronic circuitry 116 can be mounted on either side of the heat sink 118 based on the particular application of the electronic circuitry 116. The heat sink 118 includes a female mating port 120 that extends into and optionally through the heat sink 118. The female mating port 120 is configured to detachably receive (or be detachably coupled to) the tubular, rod-shaped portion 110 of the thermal regulating device 104. Thus, the female mating port 120 has a similar cross-section as the tubular, rod-shaped portion 110. When inserted into the female mating port 120, an outer surface of the tubular, rod-shaped portion 110 contacts an inner surface of the female port 120 to thereby improve the thermal transfer between the tubular, rod-shaped portion 110 and the heat sink 118.

During testing of the electronic circuitry 116, the temperature of the thermal regulating fluid is set to a predetermined temperature and is circulated through the thermal regulating device 104. The temperature of the thermal regulating fluid provides cooling or heating to the heat sink 118 to the desired temperature based on the application of the electronic circuitry 116. In addition, the temperature of the thermal regulating fluid can be adjusted over a range of temperatures where the temperature range can be tightly controlled.

Figure 2:
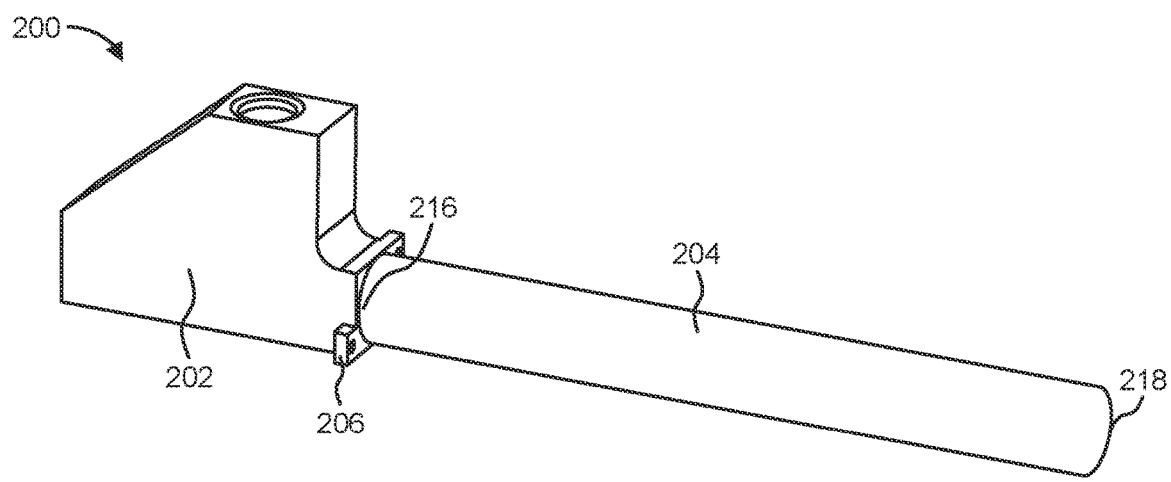
FIG. 2 illustrates an opaque perspective view of an example thermal regulating device.
Figure 3:
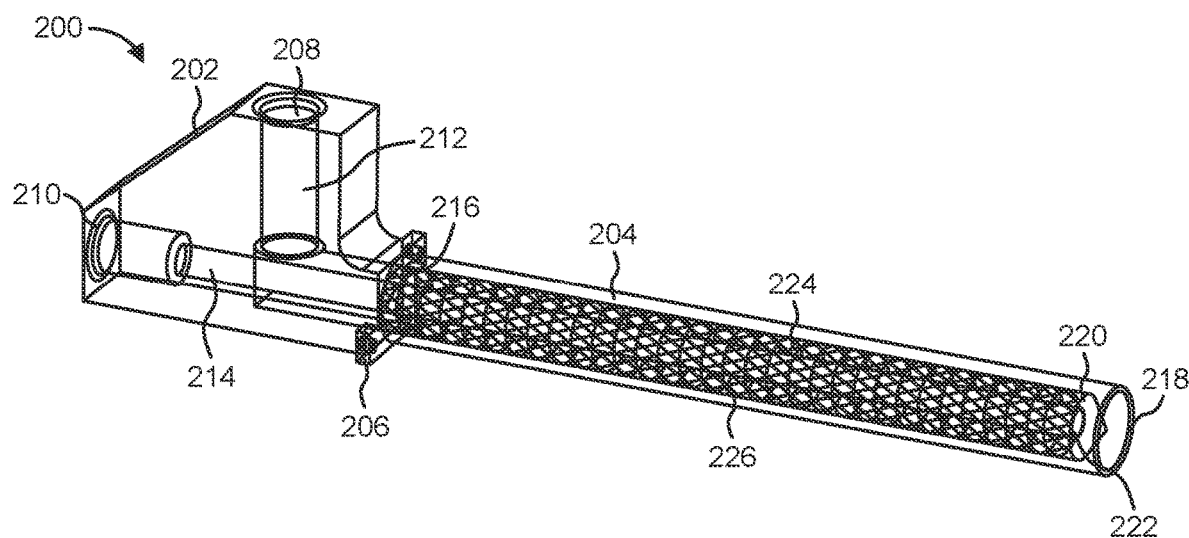
FIG. 3 illustrates a transparent perspective view of the example thermal regulating device.
Figure 4:
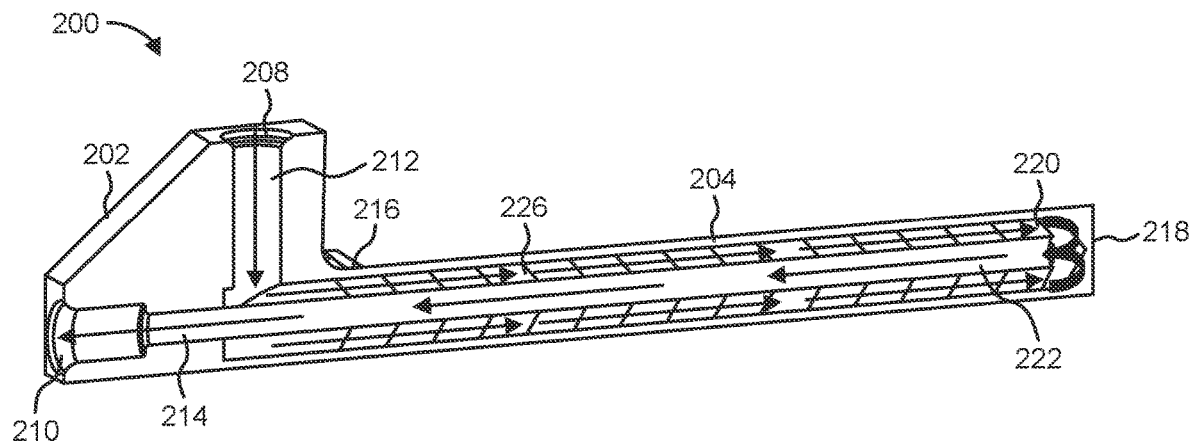
FIG. 4 illustrates a cross-sectional view of the example thermal regulating device.

FIGS. 2-4 are perspective views of a thermal regulating device 200. Specifically, FIG. 2 is an opaque perspective view, FIG. 3 is a transparent perspective view, and FIG. 4 is a cross-sectional perspective view of the thermal regulating device 200. The thermal regulating device 200 can correspond to the thermal regulating device in the example of FIG. 1. Therefore, reference is to be made to the example of FIG. 1 in the following description of the example of FIGS. 2-4.

The thermal regulating device 200 is an integrated unit made from a thermally conductive material (e.g., aluminum, copper) that includes a head portion 202 and a tubular, rod-shaped portion 204 having an axial length. As mentioned above, the thermal regulating device 200 can be fabricated via an additive manufacturing process, which eliminates weld seams between the head portion 202 and the tubular, rod-shaped portion 204, and in the tubular, rod-shaped portion 204 itself. A flange 206 is disposed between the head portion 202 and the tubular, rod-shaped portion 204. The flange 206 may include connection holes to detachably connect the thermal regulating device to an electronic circuit assembly.

The head portion 202 includes and inlet port 208 and an outlet port 210. The inlet port 208 is in fluid communication with an inlet tube 212, and the outlet port 210 is in fluid communication with an outlet tube 214, see FIGS. 3 and 4. The inlet port 208 and the outlet port 210 are arranged in the head portion 202 at an angle of approximately 90° with respect to each other. It is to be understood, however, that the angle between the inlet port 208 and the outlet port 210 can vary (e.g.,) 10°-90° based on the configuration of the thermal regulating device 200.

The tubular, rod-shaped portion 204 fluidly communicates with the head portion 202 at a first end 216 and is enclosed and an opposite second end 218. As mentioned above, the thermal regulating device 200 is configured to receive and discharge a thermal regulating fluid from a thermal regulating fluid source via the inlet and outlet ports 208, 210 of the head portion 202. Thus during testing, the tubular, rod-shaped portion 204 functions as a heat exchanger to regulate the temperature transferred (thermal transference) to an electronic circuit assembly.

The inlet tube 212 extends from the inlet port 208 of the head portion 202 into the tubular, rod-shaped portion 204. In the example illustrated in the figures, the inlet tube 212 bends at an angle of approximately 90° in the head portion 202 as the inlet tube 212 transitions into the tubular, rod-shaped portion 204. The outlet tube 214 extends from the outlet port 210 of the head portion 202 into the tubular, rod-shaped portion 204. In the example illustrated in the figures, the outlet tube 214 is arranged substantially straight from the outlet port 210 into the tubular, rod-shaped portion 204. The arrangement of both the inlet tube 212 and the outlet tube 214, however, can be any arrangement based on the configuration of the thermal regulating device 200. Thus, the example thermal regulating device illustrated in the figures is for illustrative purposes only and is not intended to limit the scope of the invention.

The outlet tube 214 is disposed inside the inlet tube 212 as both tubes 212, 214 transition from the head portion 202 to the tubular, rod-shaped portion 204. Thus, the outlet tube 214 has a smaller diameter than a diameter of the inlet tube 212. An end 220, 222 opposite that of the inlet and outlet ports 208, 210 of both the inlet and outlet tubes 212, 214 respectively are open-ended. Thus as best shown in FIG. 4, when the regulating fluid flows into the inlet port 208 and through the inlet tube 212, the regulating fluid flows out of the open end 220 of the inlet tube 212 and into the open end 222 of the outlet tube 214, through the outlet tube 214, and out the outlet port 210 as indicated by the arrows.

Referring to FIG. 3, an axial cartridge 224 made from a thermally conductive material (e.g., aluminum, copper) is disposed inside the tubular, rod-shaped portion 204. Specifically, the cartridge 224 is arranged inside the inlet tube 212 but outside the outlet tube 214. The cartridge 224 includes fins 226 that span a channel defined between an inner surface of the inlet tube 212 and an outer surface of the outlet tube 214. The fins 226 extend the length of the cartridge 224 and can be segmented (e.g., separated by ⅛") and offset in a staggered configuration from each other to facilitate the flow of the regulating fluid. As the regulating fluid flows through the inlet and outlet tubes 212, 214 the fins 226 facilitate a transfer of the thermal regulating fluid temperature to an outer surface of the tubular, rod-shaped portion 204.

Figure 5:
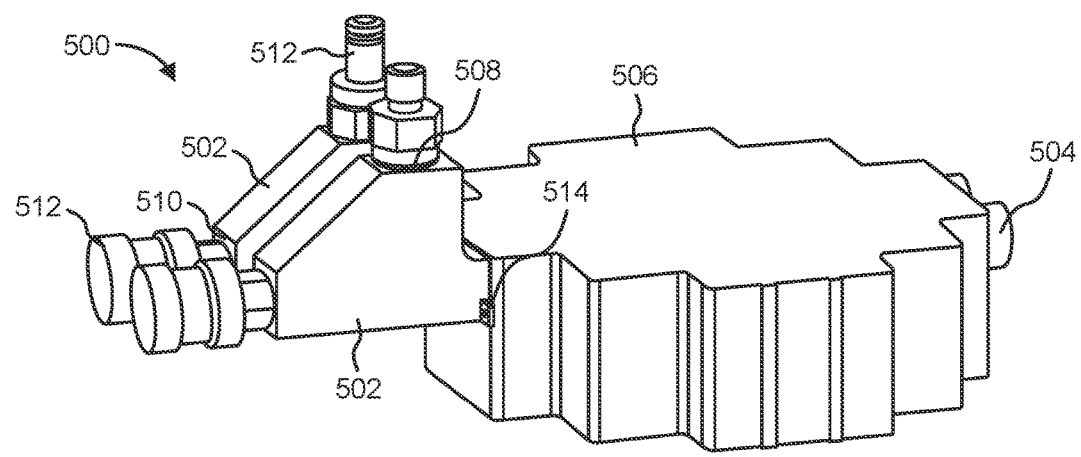
FIG. 5 illustrates a perspective view of thermal regulating devices inserted into a heat sink.

FIG. 5 is a perspective view of two thermal regulating devices 500 including a head portion 502 and a tubular, rod-shaped portion 504 inserted into a heat sink 506 of a circuit assembly. Electronic circuitry (not shown for simplicity) can be mounted on a top surface or a bottom surface of the heat sink 506. Inlet and outlet ports 508, 510 are configured to receive fluid connectors (e.g., quick disconnects) 512 to facilitate attachment of the thermal regulating devices 500 to a thermal regulating fluid source as described above. As illustrated, the tubular, rod-shaped portion 504 of the thermal regulating devices 500 is inserted into a female mating port of the heat sink 506 until a flange 514 of the thermal regulating device contacts the heat sink 506. The flange 514 may include mounting holes to removably secure the thermal regulating device 500 to the heat sink 506 during testing.

Figure 6:
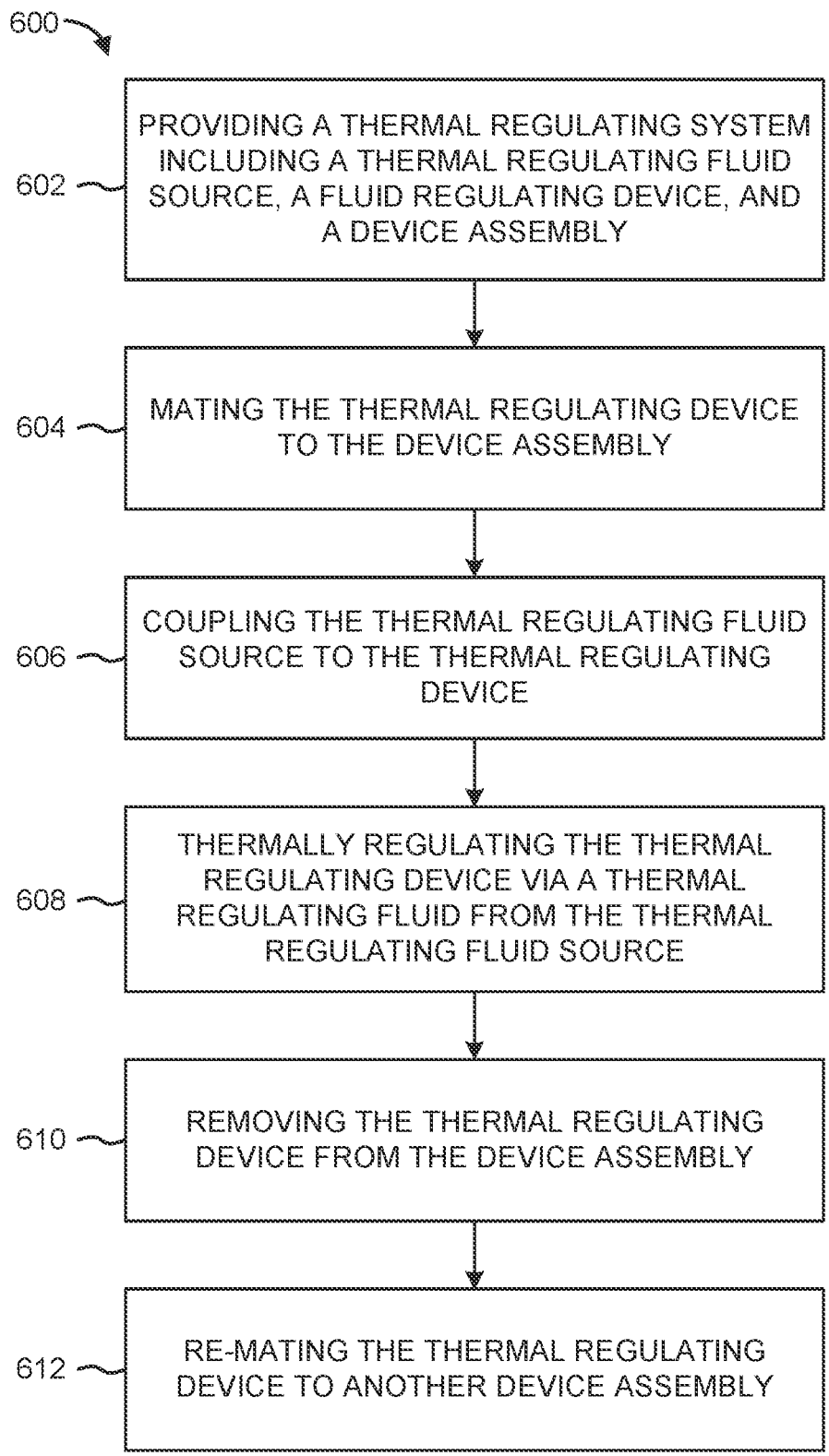
FIG. 6 illustrates an example of a method for thermally testing a device using the thermal regulating device.

FIG. 6 illustrates an example of a method 600 for thermally testing electronic circuitry using a thermal regulating device. The thermal regulating device and electronic circuitry can correspond to the thermal regulating device and the electronic in the example of FIGS. 1-5. Thus, reference is to be made to the examples of FIGS. 1-5 in the following description of the method in FIG. 6.

At 602, a thermal regulating system 100 is provided that includes a thermal regulating fluid source 102, a thermal regulating device 104, 200, and an electronic circuit assembly 106. At 604, the thermal regulating device 104, 200 is removably mated (coupled) to the electronic circuit assembly 106. More specifically, a tubular, rod-shaped portion 110, 204 of the thermal regulating device 104, 200 is inserted into a female mating port 120 of a heat sink 118, 506 of the electronic circuit assembly 106. At 606, the thermal regulating fluid source 102 is removably coupled to the thermal regulating device 104, 200. More specifically, the thermal regulating fluid source 102 is connected to an inlet port 112, 208 and an outlet port 114, 210 of the thermal regulating device 104, 200 via fluid connectors (e.g., quick disconnects) 512. At 608, the thermal regulating device 104, 200 is thermally regulated via a thermal regulating fluid from the thermal regulating fluid source 102. More specifically, a temperature of the regulating fluid in the thermal regulating fluid source 102 is set to a predetermined temperature based on electronic circuitry 116 in the electronic circuit assembly 106 undergoing testing. In addition, the thermal regulating fluid from the thermal regulating fluid source 102 is provided to the thermal regulating device 104, 200 for a predetermined time period corresponding to a duration of the thermal testing. At 610, the thermal regulating device 104, 200 is removed from the electronic circuit assembly 106. At 612, the thermal regulating device 104, 200 is removably mated (coupled) to another circuit assembly for thermal testing of electronic circuitry associated with the other electronic circuit assembly.

The descriptions above constitute examples of the disclosure. It is, of course, not possible to describe every conceivable combination of components or method for purposes of describing the disclosure, but one of ordinary skill in the art will recognize that many further combinations and permutations of the disclosure are possible. Accordingly, the disclosure is intended to embrace all such alterations, modifications, and variations that fall within the scope of this application, including the appended claims.

What is claimed is:

1. A thermal regulating device comprising:
a head portion including an inlet port and an outlet port;
an inlet tube coupled to the inlet port of the head portion;
an outlet tube coupled to the outlet port of the head portion, the outlet tube being disposed inside the inlet tube;
a tubular, rod-shaped portion in fluid communication with the head portion at a first end and being enclosed at a second end opposite that of the first end; and
an axial cartridge disposed in the tubular, rod-shaped portion, the axial cartridge providing thermal transfer to an outer surface of the tubular, rod-shaped portion, the axial cartridge including fins disposed along the cartridge from the first end to the second end of the tubular, rod-shaped portion and that span a channel defined between an inner surface of the inlet tube and an outer surface of the outlet tube, the fins being segmented and offset in a staggered configuration from each other,
wherein the tubular, rod-shaped portion detachably mates with a device to provide thermal transfer to the device.

2. The thermal regulating device of claim 1, wherein the inlet tube transitions from the head portion to the tubular, rod-shaped portion at an angle and the outlet tube transitions from the head portion to the tubular, rod-shaped portion substantially straight and is disposed inside the inlet tube in the tubular, rod-shaped portion.

3. The thermal regulating device of claim 1, wherein the fins facilitate thermal transfer to the outer surface of the tubular, rod-shaped portion.

4. A method for providing thermal testing of a device comprising:
providing a thermal regulating system including a thermal regulating fluid source, a thermal regulating device, and a device for thermal regulation;
removably inserting a tubular, rod shaped portion of the thermal regulating device into a female mating port of a heat sink of the device, the tubular, rod shaped portion having an axial cartridge disposed therein, the axial cartridge including fins arranged along the axial cartridge from a first end to a second end of the tubular, rod-shaped portion;
removably coupling the thermal regulating fluid source to the thermal regulating device;
thermally regulating the thermal regulating device via a thermal regulating fluid from the thermal regulating fluid source during the thermal testing of the device, wherein thermally regulating the thermal regulating device includes providing thermal transfer to an outer surface of the tubular, rod shaped portion via the fins, the fins being segmented and offset in a staggered configuration from each other; and
removing the thermal regulating device from the device upon completion of the thermal testing of the device.

5. The method of claim 4 further comprising removably mating the thermal regulating device to another device and thermally regulating the thermal regulating device via the thermal regulating fluid from the thermal regulating fluid source during thermal testing of the other device.

6. The method of claim 4, wherein removably coupling the thermal regulating fluid source to the thermal regulating device includes removably connecting the thermal regulating fluid source to an inlet port and an outlet port of the thermal regulating device via fluid connectors.

7. The method of claim 4, wherein thermally regulating the thermal regulating device via a thermal regulating fluid from the thermal regulating fluid source includes setting a temperature of the regulating fluid in the thermal regulating fluid source to a predetermined temperature based the device undergoing testing.

8. The method of claim 7, further comprising providing the regulating fluid from the thermal regulating fluid source to the thermal regulating device for a predetermined time period corresponding to a duration of the thermal testing.

9. The method of claim 8, further comprising adjusting the temperature of the regulating fluid over a range of temperatures based on the device undergoing the thermal testing.

10. A thermal testing system comprising:
an electronic circuit assembly comprising a heat sink;
a thermal regulating device removably coupled to the heat sink of the electronic circuit assembly, the thermal regulation device comprising:
a head portion including an inlet port and an outlet port;
an inlet tube coupled to the inlet port of the head portion;
an outlet tube coupled to the outlet port of the head portion, the outlet tube being disposed inside the inlet tube;
a tubular, rod-shaped portion in fluid communication with the head portion at a first end and being enclosed at a second end opposite that of the first end; and
an axial cartridge disposed in the tubular, rod-shaped portion, the axial cartridge providing thermal transfer to an outer surface of the tubular, rod-shaped portion, the axial cartridge including fins disposed along the cartridge from the first end to the second end of the tubular, rod-shaped portion and that span a channel defined between an inner surface of the inlet tube and an outer surface of the outlet tube, the fins being segmented and offset in a staggered configuration from each other; and
a thermal regulating fluid source removably coupled to the thermal regulating device to provide a thermal regulating fluid to the thermal regulating device,
wherein the thermal regulating device is configured to receive and discharge the thermal regulating fluid from the thermal regulating fluid source to regulate thermal transference to the electronic circuit assembly via the heat sink.

11. The thermal testing system of claim 10, wherein the inlet tube transitions from the head portion to the tubular, rod-shaped portion at an angle and the outlet tube transitions from the head portion to the tubular, rod-shaped portion substantially straight and is disposed inside the inlet tube in the tubular, rod-shaped portion.

12. The thermal testing system of claim 10, the fins facilitate thermal transfer to the outer surface of the tubular, rod-shaped portion.

* * * * *